United States Patent
Horch et al.

(10) Patent No.: US 6,845,044 B2
(45) Date of Patent: Jan. 18, 2005

(54) METHOD OF PREVENTING HIGH ICC AT START-UP IN ZERO-POWER EEPROM CELLS FOR PLD APPLICATIONS

(75) Inventors: Andrew Horch, Sunnyvale, CA (US); Michael Rowlandson, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 331 days.

(21) Appl. No.: 10/061,057

(22) Filed: Jan. 29, 2002

(65) Prior Publication Data

US 2003/0143793 A1 Jul. 31, 2003

(51) Int. Cl.[7] .............................................. G11C 16/04
(52) U.S. Cl. .............................. 365/185.24; 365/185.01
(58) Field of Search ........................ 365/185.01, 185.24

(56) References Cited

U.S. PATENT DOCUMENTS

| | | | |
|---|---|---|---|
| 4,885,719 A | 12/1989 | Brahmbhatt ................ 365/181 |
| 5,128,863 A | * 7/1992 | Nakamura et al. ............ 463/44 |
| 5,272,268 A | 12/1993 | Turner et al. ................ 257/315 |
| 5,272,368 A | * 12/1993 | Turner et al. ............ 365/185.1 |
| 5,469,076 A | * 11/1995 | Badyal et al. ................ 326/16 |

* cited by examiner

Primary Examiner—Van Thu Nguyen

(57) ABSTRACT

A CMOS memory cell (FIG. 1) is provided which includes a PMOS transistor (102) and an NMOS transistor (104) with a common floating gate and common drains configured to prevent a large drain of Icc current from a power supply during power-up. To prevent the large Icc during power-up, the threshold voltages of the PMOS transistor (102) and NMOS transistor (104) are set so that the PMOS transistor (102) and NMOS transistor (104) do not turn on together, irrespective of charge initially stored on the floating gate. Without such thresholds, a significant drain of current Icc from the power supply connection Vcc can occur since charge initially on the floating gate leaves both the PMOS transistor (102) and the NMOS transistor (104) on creating a path for Icc from Vcc to Vss.

6 Claims, 6 Drawing Sheets

METHOD OF PREVENTING HIGH ICC AT START-UP IN ZERO-POWER EEPROM CELLS FOR PLD APPLICATIONS

BACKGROUND OF THE INVENTION

1. Field of the Invention

The present invention relates generally to zero power non-volatile CMOS memory cells used with high density programmable logic devices (PLDs). More particularly, the present invention relates to a method for preventing turn-on of both transistors in a CMOS memory cell causing a significant drain on power supply current (Icc).

2. Background

Figure 1:
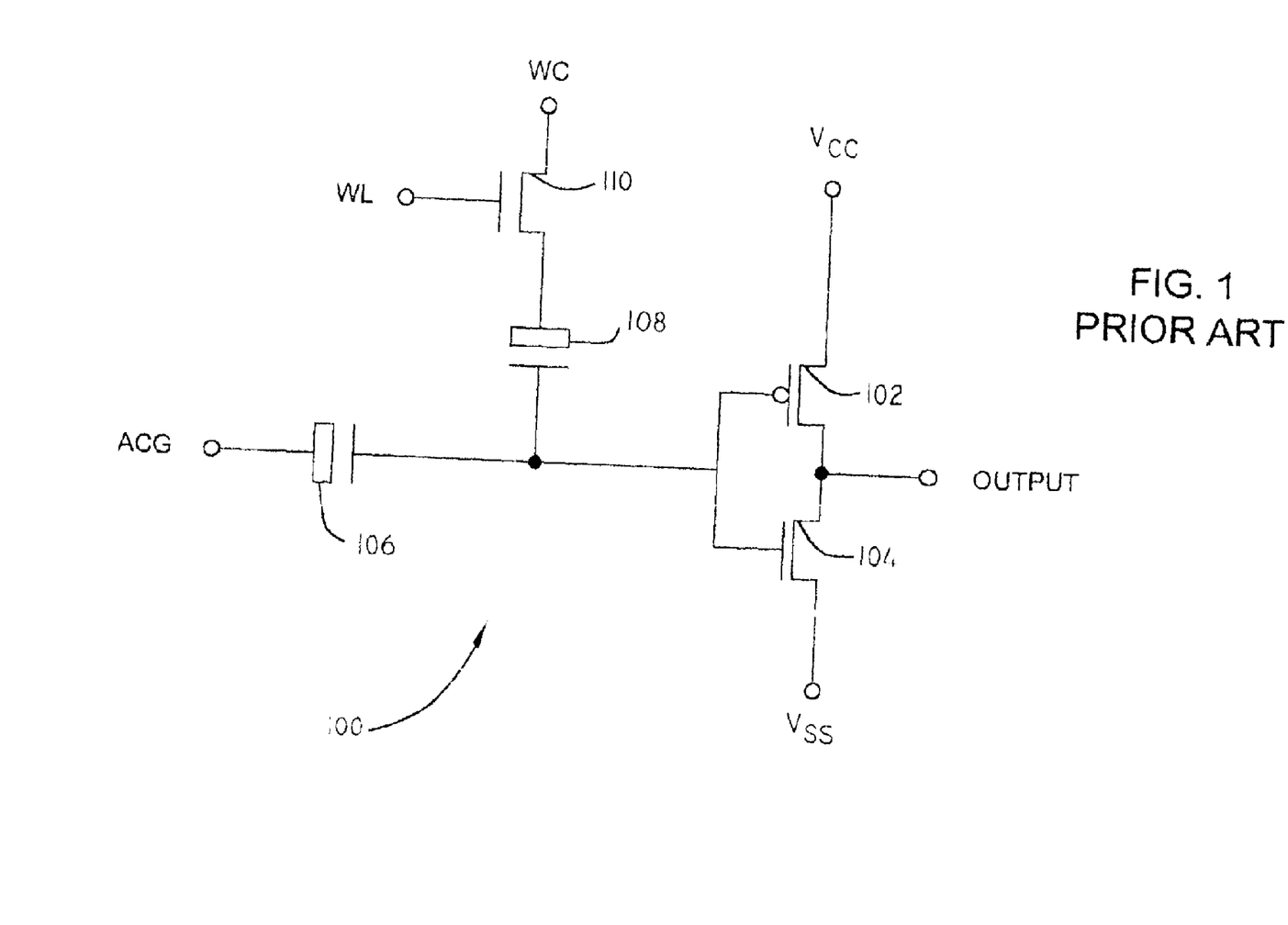
FIG. 1 shows a conventional CMOS memory cell.

FIG. 1 shows a conventional CMOS EEPROM memory cell for PLD applications. The memory cell 100 includes a PMOS transistor 102 and an NMOS transistor 104 with a common floating gate. Drains of transistors 102 and 104 are connected together to form the output of the CMOS cell 100. Capacitors 106 and 108 are connected to couple voltage to the common floating gate. Bias voltage is provided to the source of PMOS transistor 102 from a chip Vcc pin. Bias voltage is provided to the source of the NMOS transistor 104 through a chip ground or Vss pin. Control capacitor 106 supplies voltage from an array control gate (ACG) node. An NMOS pass transistor 110 supplies a word control (WC) voltage to tunneling capacitor 108 as controlled by a word line (WL) voltage supplied to its gate. The CMOS memory cell 100 is disclosed in U.S. Pat. No. 5,272,368 entitled "Complementary Low Power Non-Volatile Reconfigurable EECELL," and in U.S. Pat. No. 4,885,719 entitled "Improved Logic Cell Array Using CMOS $E^2$PROM Cells."

Typical voltages applied for program, erase and read of the CMOS memory cell 100 are listed in Table I below. Programming indicates electrons are removed from the common floating gate, while erase indicates that electrons are added to the common floating gate.

TABLE I

|  | WC | WL | ACG | Vcc | Vss |
| --- | --- | --- | --- | --- | --- |
| Program | 12 | 13.8 | 0 | 0 | 0 |
| Erase | 0 | 5 | 13.8 | 12 | 12 |
| Read | 2.5 | 5 | 2.5 | 5 | 0 |

The program, erase and read voltages of Table I are for transistors having a Vcc of approximately 5 volts during read operations. For lower voltage transistors operating with a lower Vcc, such as 1.8 volts, the voltages shown in Table I may be significantly reduced.

Figure 2A:
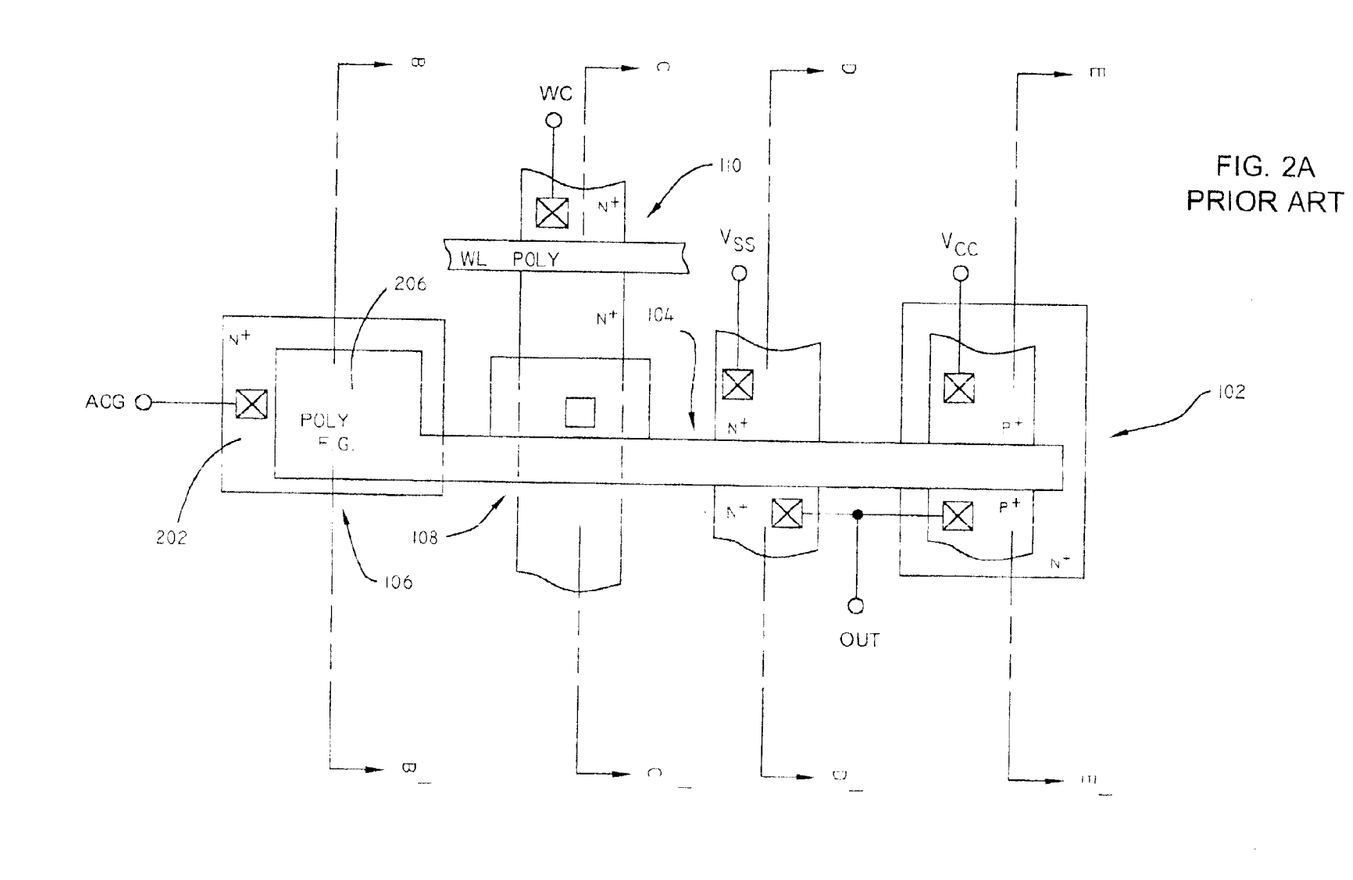
FIG. 2A shows the layout for the CMOS memory cell of FIG. 1.

FIG. 2A shows a layout for the CMOS cell 100 of FIG. 1, while FIGS. 2B-2E show respective cross sectional views at BB', CC', DD' and EE' in FIG. 2A. The layout for the CMOS cell shown in FIGS. 2A–2E is formed in a p type substrate.

Figure 2B:
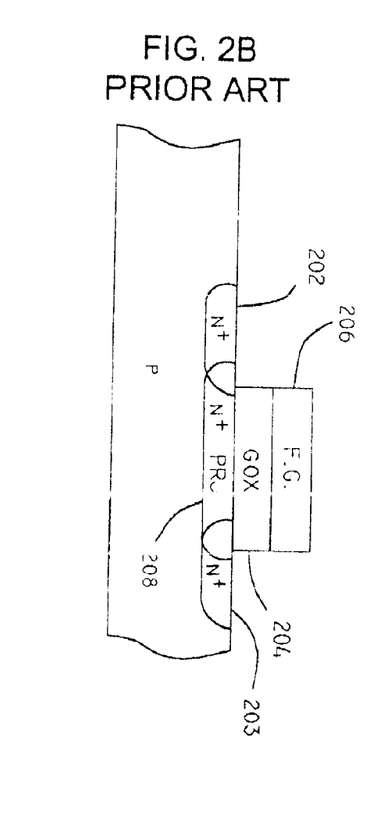
FIGS. 2B–2E show respective cross sectional views at BB', CC', DD' and EE' in FIG. 2A.

As shown in FIGS. 2A and 2B, control capacitor 106 includes n+ type implant regions 202 and 203 formed in the p type substrate. Overlying the n+ type implant regions 202 and 203 is a gate oxide layer (GOX) region 204. Provided above the gate oxide layer 204 is the common floating gate (F.G.) 206.

Figure 2C:
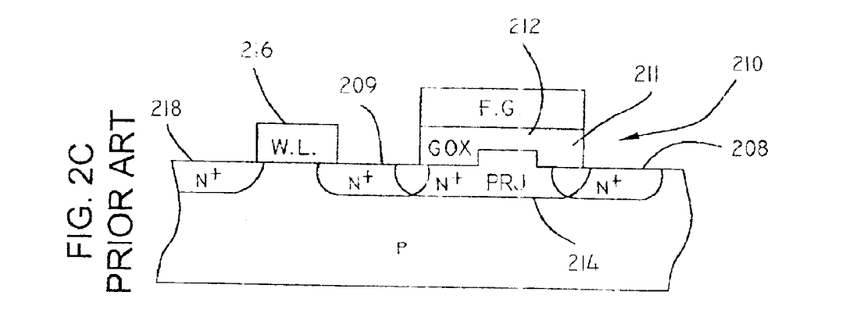

As shown in FIGS. 2A and 2C, the tunneling capacitor 108 includes n+ implant regions 208 and 209 formed in the p type substrate. Overlying the n+ type implant regions 208 and 209 is a gate oxide 210 which includes a standard thickness portion 211 and a thinner tunneling portion 212. Overlying the gate oxide 210 is the common floating gate 206. The tunneling portion 212 of the gate oxide 210 provides a region to enable electrons to be applied to the floating gate 206 during erase and removed during programming.

As further shown in FIGS. 2A and 2C, the pass transistor 110 is formed by a polysilicon (POLY) word line (WL) region 216 on the substrate with a portion of region 216 overlying a drain n+ implant region 209 and another portion overlying a source n+ implant region 218.

Figure 2D:
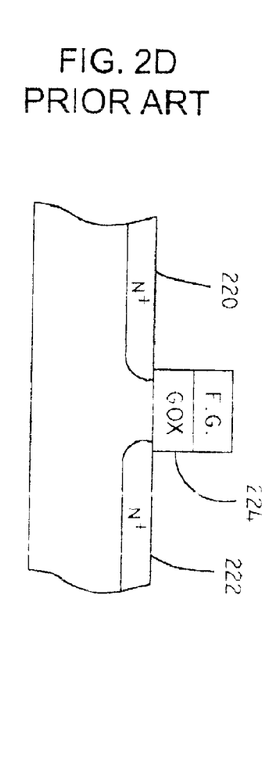

As shown in FIGS. 2A and 2D, the NMOS transistor 104 includes source and drain n+ implant regions 220 and 222 in the p substrate. A gate oxide region 224 is placed on the substrate bridging regions 222 and 220. The common floating gate 206 overlies the gate oxide region 224.

Figure 2E:
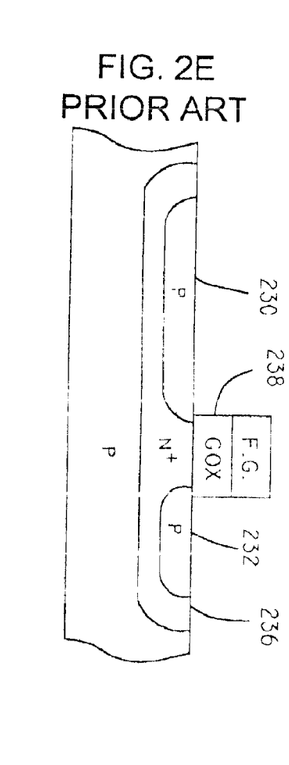

As shown in FIGS. 2A and 2E, the PMOS transistor 102 includes p type source and drain regions 230 and 232 included in a n+ type well 236 which is included in the p type substrate. A gate oxide region 238 is placed on the substrate bridging the regions 230 and 232. The common floating gate 206 overlies the gate oxide region 238.

The CMOS memory cell 100 is advantageous because it enables zero power operation, zero power operation indicating that a component does not continually draw power when the component is not changing states. For instance, with an appropriate voltage applied to the common floating gate 206, PMOS transistor 102 will conduct and NMOS transistor 104 will not conduct. Current will then be provided from Vcc through PMOS transistor 102 to the output until the output is charged up to Vcc. In this configuration, no current will be provided through NMOS transistor 104 to Vss. Further, with another voltage stored on the common floating gate 206, NMOS transistor 104 will conduct while PMOS transistor 102 does not. The output will then discharge to Vss. No additional current will be provided through PMOS transistor 102 from Vcc to Vss.

To assure transistors 102 and 104 operate like a typical inverter, however, transistors 102 and 104 have threshold voltages set such that the CMOS inverter formed by transistors 102 and 104 in FIG. 1 will "switch" output states with transistors 102 and 104 transitioning together between OFF and ON states when charge is added to the floating gate or removed from the floating gate. In such a manufacturing process, the PMOS transistor 102 will have a threshold overlapping with a threshold of the NMOS transistor 104.

Figure 3A:
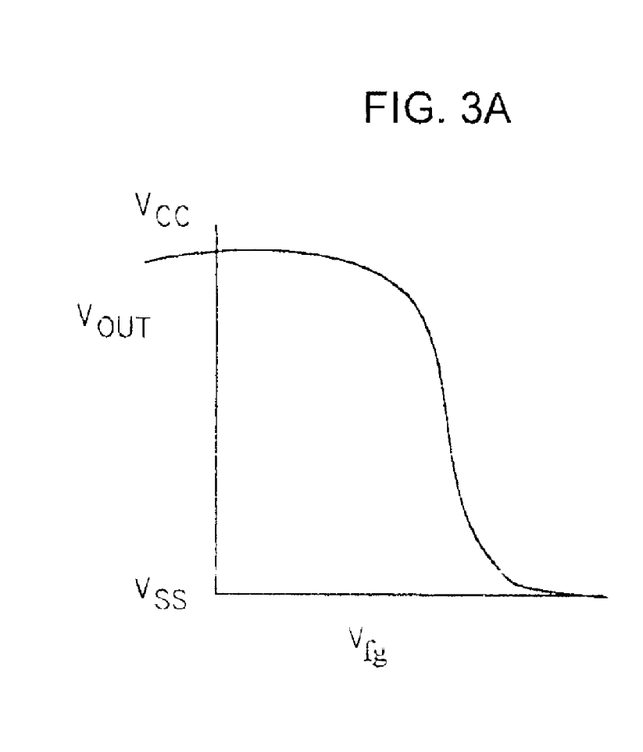
FIGS. 3A and 3B shows typical transfer characteristics of the CMOS memory cell of FIG. 1.
Figure 3B:
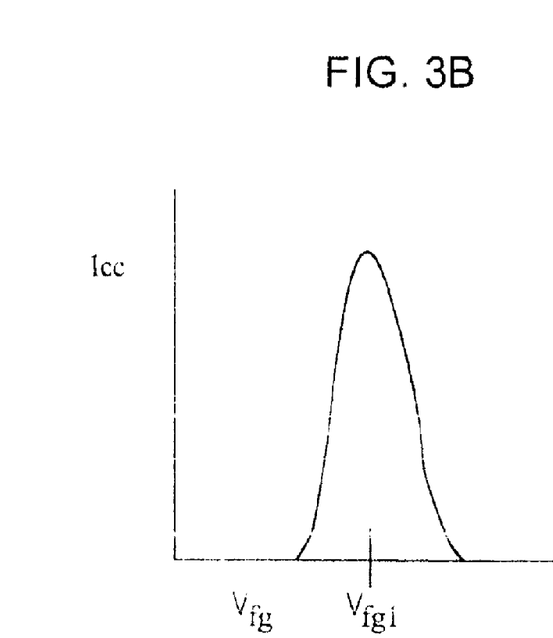

The transfer characteristics of CMOS transistors 102 and 104 manufactured in such a manner are shown in FIGS. 3A and 3B. As shown in FIG. 3A, PMOS transistor 102 remains ON for a floating gate to source voltage (Vfg) within a set range, driving the OUTPUT voltage $V_{OUT}$ to Vcc. And then, the PMOS transistor 102 will transition to OFF while the NMOS transistor 104 transitions to ON when the floating gate to source voltage increases further driving $V_{OUT}$ to Vss. FIG. 3B illustrates a region Vfg1 where both the PMOS transistor 102 and the NMOS transistor 104 are on together.

The fault with the CMOS memory cell design shown in FIG. 1 with cells configured to "switch" occurs when the memory cell has an initial charge on the control capacitor 106 such that the floating gate is biased to the value Vfg1. At this bias voltage, 102 and 104 will both be ON or in a conducting state so a large Icc current can flow from Vcc to Vss through the transistors 102 and 104.

The first time the CMOS memory cell 100 is powered up, the charge on the floating gate 206 is unknown as it will be the residual amount of charge on the floating gate 206 after wafer fab processing. As a result, it is possible for the floating gate to be initially biased such that both transistors 102 and 104 are ON. If both transistors are ON, it may prevent the part from powering up properly as the memory array may contain multiple devices, creating a short circuit between Vcc and Vss capable of sourcing substantial current Icc and effectively shorting out the power supply to the chip.

A number of methods have been contemplated for preventing a substantial Icc from being drawn and affecting power-up of the chip. A first method is to provide additional current regulation circuitry in the power supply to limit the amount of current Icc provided to the memory array. A second method is to supply power to the memory array from a power supply separate from a power supply for the remaining chip circuitry. The separate power supply for the memory may then be shorted without preventing the overall part from powering up properly. A combination of the first and second methods have also been contemplated.

SUMMARY

In accordance with the present invention, a CMOS memory cell is provided which prevents a significant drain of current Icc during power-up. The CMOS memory cell is configured as shown in FIG. 1, but with the threshold voltages of the PMOS transistor 102 and NMOS transistor 104 set so that the PMOS transistor 102 and NMOS transistor 104 do not turn on together, irrespective of charge initially stored on the floating gate. In other words, the threshold voltages for the PMOS transistor 102, Vt(102), and the NMOS transistor 104, Vt(104), are set such that Vt(102)>Vfgl and |Vt(104)|<Vfgl.

With the threshold voltages of the NMOS transistor (102) and PMOS transistor (104) so set, at power-up there is no value of Vfg for which high Icc current flows, since there is no bias condition on the floating gate which will bias both the PMOS transistor 102 and NMOS transistor 104 to the ON state. Such thresholds are not desirable for a normal inverter since it is required to "switch", but in the case of a CMOS memory cell where the switching of a gate is done only for purposes of programming, the normal cell switching considerations need not apply.

A CMOS memory cell configured in accordance with the present invention offers the advantage or reduced circuit complexity, since modifications to the power supply to control or withstand a significant additional current Icc upon startup are not required. Likewise, with a reduced sized power supply an integrated circuit chip containing the CMOS memory array can be manufactured on a smaller die size chip.

BRIEF DESCRIPTION OF THE DRAWINGS

The present invention will be described with respect to particular embodiments thereof, and references will be made to the drawings in which.

DETAILED DESCRIPTION

In accordance with the present invention, the threshold voltage of transistors 102 and 104 are modified such that there is no floating gate charge for which both devices are normally on. In other words, the threshold voltages for the transistors 102 and 104 are set such that Vt(102)>Vfgl and |Vt(104)|<Vfgl, and no short circuit exists at power-up.

In a manufacturing process for such transistors, the NMOS transistor 104 will have a threshold set slightly more positive than zero and the PMOS transistor 102 will have a threshold slightly more negative than zero to assure one transistor is always off. Thus, there will be no range such as Vfgl shown in FIG. 3B where both the PMOS transistor 102 and the NMOS transistor 104 will be ON.

Figure 4A:
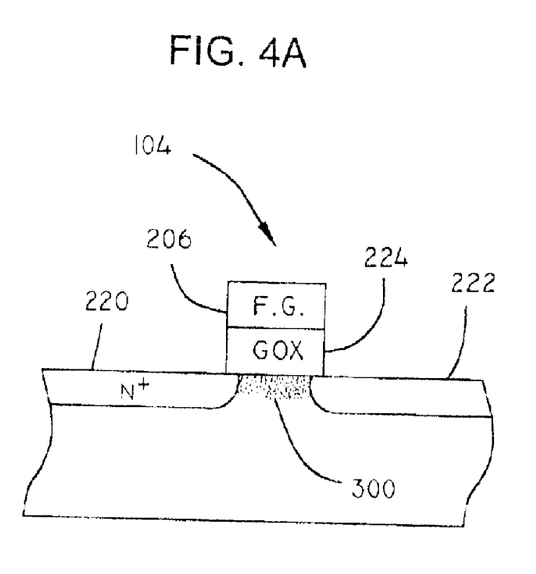
FIGS. 4A and 4B show modifications to the PMOS and NMOS transistors 102 and 104 to change their thresholds to prevent a large Icc at power up.
Figure 4B:
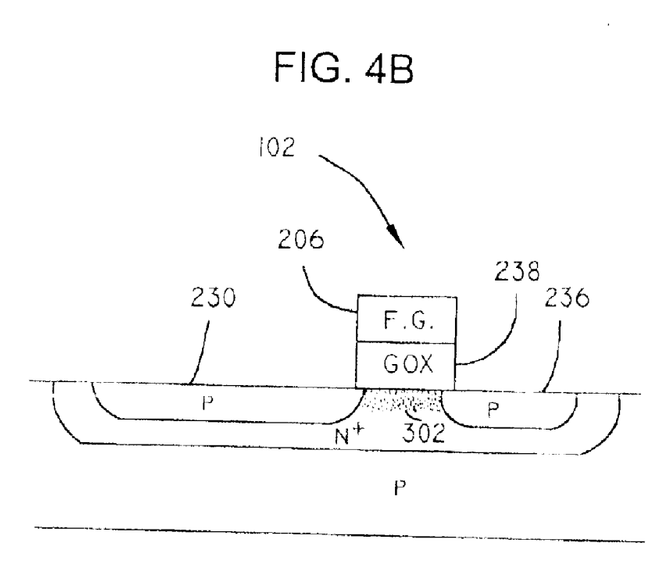

FIGS. 4A and 4B illustrate modifications to the transistors 102 and 104 to change the transistor thresholds. To increase the threshold of the NMOS transistor 104, additional positive ion implantation 300 can be added to the NMOS transistor channel region between its source 220 and drain 222. The positive ions can in one embodiment be arsenic. Similarly, to decrease the threshold of the PMOS transistor 102 during manufacture additional negative ion implantation 302 can be added to the PMOS transistor channel region between its source 230 and drain 236. The negative ions can in one embodiment be from boron.

The threshold voltage for a transistor is the gate to source voltage required for the transistor to turn on, turning on meaning that current is conducted between its source and drain. With the source of the NMOS transistor 104 connected to Vss, which is typically fixed at ground, the floating gate voltage at its threshold is readily discernable. But, with the source of the PMOS transistor 102 connected to Vcc, which may vary, the floating gate voltage at its threshold is not as easily discerned. In accordance with the present invention, the threshold of the PMOS transistor 102 is set so that no overlap will occur with the NMOS transistor 104 threshold within a desired range of possible Vcc values.

In one embodiment of the present invention, the value of the threshold of the PMOS transistor 102 is set so that no overlap will occur with the NMOS transistor 104 transistor within the normal operating specification voltages for Vcc. A chip when manufactured and provided to a customer is typically certified to function to specifications for outputs and inputs and other parameters with Vcc voltages provided to a Vcc pin within a predetermined range. In this one embodiment the PMOS transistor 102 threshold is set using this Vcc specification range.

In another embodiment of the present invention, the value of the threshold of the PMOS transistor 102 is set so that no overlap will occur with the NMOS transistor 104 threshold from ground, or Vss up through the specified range for Vcc. This embodiment assures that no overlap will occur between the PMOS transistor 102 and NMOS transistor 104 during power-up when no pin voltages are applied, or all pins are at zero volts, to complete power up where the Vcc pin voltage is brought up to a value for Vcc within specifications.

Figure 5A:
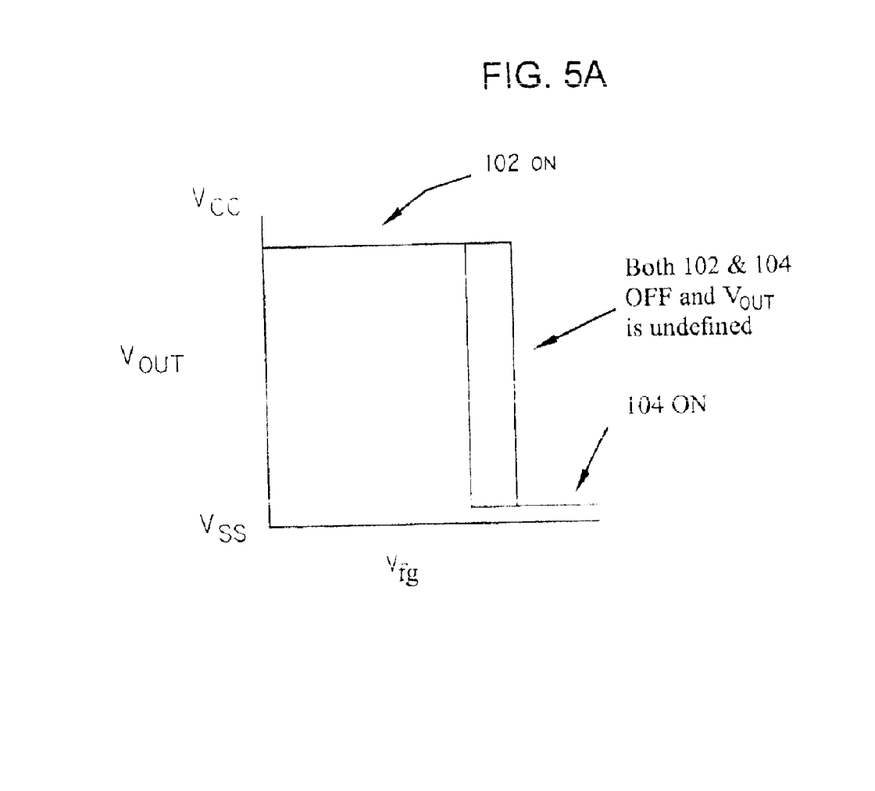
FIGS. 5A and 5B show transfer characteristics of a memory cell in accordance with the present invention.
Figure 5B:
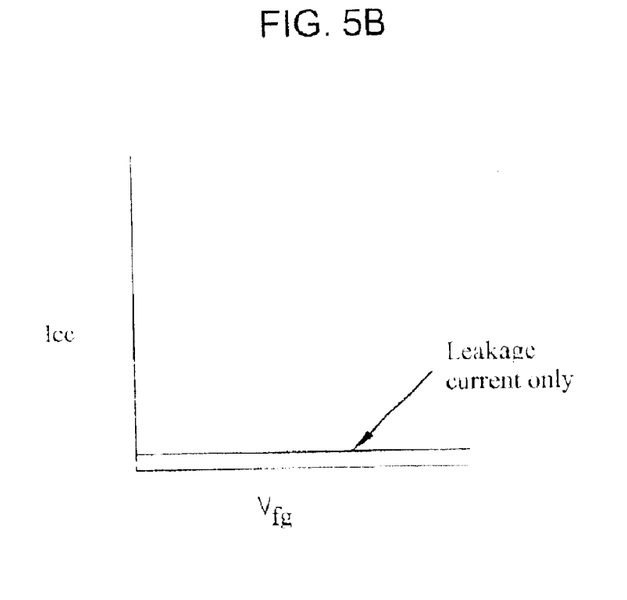

FIGS. 5A and 5B show the transfer characteristics for the memory cell in accordance with the present invention. As shown in FIG. 5A, with limited floating gate charge (Vfg) only PMOS transistor 102 is on, causing the output voltage Vout to go to Vcc. With Vfg increasing at one point shown by the hatched lines, both transistor 102 and 104 will be off preventing any current Icc from flowing from Vcc to Vss. With Vfg increasing further, the NMOS transistor 104 turns on causing Vout to go to Vss. As shown in FIG. 5B, at no point for the floating gate voltage Vfg is a significant Icc current drawn, only a minimal Icc leakage current.

Although the present invention has been described above with particularity, this was merely to teach one of ordinary skill in the art how to make and use the invention. Many other modifications will fall within the scope of the invention, as that scope is defined by the claims provided below.

What is claimed is:

1. An array of CMOS memory cells, each memory cell in the array comprising:
   a PMOS transistor having a source coupled to Vcc, a drain and a floating gate, the PMOS transistor having ion implantation in a substrate between its source and drain to set a first threshold value for the PMQS transistor;
   an NMOS transistor with a source coupled to Vss, a drain in common with the PMOS transistor and a floating gate in common with the PMOS transistor;
   a control capacitor having one terminal in common with the floating gate;
   a tunneling capacitor having one terminal in common with the floating gate and a second terminal; and
   a pass transistor having a source-drain path connected to the second terminal of the tunneling capacitor,
   wherein the first threshold value is set so that charge cannot be provided to the floating gate causing both the NMOS and the PMOS transistor to be turned on together.

2. The array of claim 1, wherein the NMOS transistor has ion implantation in a substrate between its source and drain to set a second threshold value for the NMOS transistor.

3. The array of claim 2,
   wherein the first threshold voltage is altered by implanting ions in a channel between the source and drain of the NMOS transistor, and
   wherein the second threshold value is altered by Implanting ions between the source and drain of the PMOS transistor.

4. The array of claim 3,
   wherein the ions implanted in the channel of the NMOS transistor are arsenic; and
   wherein the ions implanted in the channel of the PMOS transistor are boron.

5. The array of claim 2 wherein the first threshold value and the second threshold value are set so that charge cannot be provided on the floating gate causing both the PMOS transistor and the NMOS transistor to turn on together when Vcc is provided within a specified operation range.

6. The array of claim 2 wherein the first threshold value and the second threshold value are set so that charge cannot be provided on the floating gate causing both the PMOS transistor and the NMOS transistor to turn on together when Vcc is ramped up from zero volts to a value within a specified operation range.

* * * * *

UNITED STATES PATENT AND TRADEMARK OFFICE
CERTIFICATE OF CORRECTION

PATENT NO. : 6,845,044 B2
DATED : January 18, 2005
INVENTOR(S) : Andrew Horch et al.

It is certified that error appears in the above-identified patent and that said Letters Patent is hereby corrected as shown below:

Column 5,
Line 11, "PMQS" should be -- PMOS --.

Column 6,
Lines 5-6, "Implanting" should be -- implanting --.

Signed and Sealed this

Seventh Day of June, 2005

JON W. DUDAS
*Director of the United States Patent and Trademark Office*